US008144517B2

(12) United States Patent
Kim et al.

(10) Patent No.: US 8,144,517 B2
(45) Date of Patent: Mar. 27, 2012

(54) MULTILAYERED NONVOLATILE MEMORY WITH ADAPTIVE CONTROL

(75) Inventors: Doo Gon Kim, Hwaseong-si (KR); Ki Tae Park, Seongnam-si (KR); Myoung Gon Kang, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 10 days.

(21) Appl. No.: 12/472,033

(22) Filed: May 26, 2009

(65) Prior Publication Data

US 2009/0273977 A1 Nov. 5, 2009

Related U.S. Application Data

(63) Continuation-in-part of application No. 12/035,732, filed on Feb. 22, 2008, now Pat. No. 7,675,783.

(30) Foreign Application Priority Data

Jul. 7, 2008 (KR) ........................ 10-2008-0065678

(51) Int. Cl.
*G11C 16/04* (2006.01)

(52) U.S. Cl. ......... 365/185.18; 365/185.17; 365/185.19; 365/185.28; 365/185.29

(58) Field of Classification Search ............. 365/185.18, 365/185.19, 185.28, 185.29
See application file for complete search history.

(56) References Cited

U.S. PATENT DOCUMENTS

| 6,614,689 B2* | 9/2003 | Roohparvar | 365/185.22 |
| 6,751,121 B2* | 6/2004 | Marotta | 365/185.09 |
| 2003/0031056 A1 | 2/2003 | Roohparvar | |
| 2005/0280072 A1 | 12/2005 | Naso et al. | |
| 2006/0015691 A1 | 1/2006 | Louie et al. | |
| 2008/0043537 A1* | 2/2008 | Tanikawa et al. | 365/185.23 |
| 2008/0048237 A1 | 2/2008 | Iwata | |
| 2008/0098164 A1* | 4/2008 | Lee et al. | 711/103 |
| 2008/0158982 A1* | 7/2008 | Chu et al. | 365/185.21 |
| 2009/0261953 A1* | 10/2009 | Kang et al. | 340/10.4 |

FOREIGN PATENT DOCUMENTS

| KR | 1020040041750 | 5/2004 |
| KR | 1020070092668 | 9/2007 |
| WO | 01/61703 | 8/2001 |

OTHER PUBLICATIONS

Communication issued on Feb. 4, 2011 from the European Patent Office in corresponding EP Application No. 09251748.1-2210.

* cited by examiner

*Primary Examiner* — Hoai V Ho
(74) *Attorney, Agent, or Firm* — F. Chau & Associates, LLC

(57) ABSTRACT

A method and device for adaptive control of multilayered nonvolatile semiconductor memory are provided, the device including memory cells organized into groups and a control circuit having a look-up matrix for providing control parameters for each of the groups, where characteristics of each group are stored in the look-up matrix, and the control parameters for each group are responsive to the stored characteristics for that group; the method including organizing memory cells into groups, storing characteristics for each group in a look-up matrix, providing control parameters for each of the groups, where the control parameters for each group are responsive to its stored characteristics, and driving each memory cell in accordance with its provided control parameters.

35 Claims, 18 Drawing Sheets

MULTILAYERED NONVOLATILE MEMORY WITH ADAPTIVE CONTROL

CROSS-REFERENCE TO RELATED APPLICATION

This application is a continuation-in-part of U.S. patent application Ser. No. 12/035,732 now U.S. Pat. No. 7,675,783 filed on Feb. 22, 2008, and claims foreign priority under 35 U.S.C. §119 to Korean Patent Application No. 10-2008-0065678, filed on Jul. 7, 2008, in the Korean Intellectual Property Office, the disclosures of which are incorporated by reference herein in their entireties.

BACKGROUND OF THE INVENTION

The present disclosure generally relates to nonvolatile semiconductor memory devices. More particularly, the present disclosure relates to multilayered nonvolatile semiconductor memory devices having adaptive control schemes.

SUMMARY OF THE INVENTION

The present disclosure provides multilayered nonvolatile semiconductor memory devices with adaptive control schemes. Exemplary embodiments are provided.

An exemplary embodiment memory device is provided, the device comprising: a plurality of memory cells organized into a plurality of groups; and a control circuit having a look-up matrix for providing control parameters for each of the plurality of groups, wherein characteristics of each group are stored in the look-up matrix, and the control parameters for each group are responsive to the stored characteristics for that group.

Another exemplary embodiment memory device provides each of the plurality of groups having characteristics differing with location of the group within the structure of the device. Another exemplary embodiment provides each of the plurality of groups having characteristics differing in accordance with electronic test results for the device. Another exemplary embodiment further comprises a memory array having a spare area, wherein the characteristics are retrieved from the spare area and stored in the look-up matrix. Another exemplary embodiment further comprises a memory array, wherein the look-up table is nonvolatile memory separate from the memory array and the characteristics are provided by the look-up table.

Yet another exemplary embodiment memory device provides the characteristics for each group comprising at least one of program conditions, read conditions, or erase conditions. Another exemplary embodiment provides the program conditions comprising at least one of an incremental step pulse programming voltage, a start voltage, a program control voltage, a maximum number of loops, a one-cycle program time, or a verification voltage for each state. Another exemplary embodiment provides the read conditions comprising at least one of a select read voltage, a read control voltage, or a one-cycle read time. Another exemplary embodiment provides the erase conditions comprising at least one of an erase voltage or an erase time.

Another exemplary embodiment memory device provides that a range of at least one control parameter for each group is different from a range of the at least one control parameter for each other group. Another exemplary embodiment provides that the memory cells are NAND flash memory cells. A further exemplary embodiment provides the control parameters comprising at least one loop program voltage applied to a page of NAND flash memory. Another exemplary embodiment provides the control parameters comprising at least one loop read voltage applied to a page of NAND flash memory. Another exemplary embodiment provides the control parameters comprising at least one erase voltage applied to a block of NAND flash memory.

Still another exemplary embodiment memory device provides that the memory cells are nonvolatile. Another exemplary embodiment provides the plurality of memory cells comprising at least two layers of memory cells, wherein the stored characteristics and provided control parameters are different for each layer. Another exemplary embodiment provides the look-up matrix comprising: a look-up table having at least one characteristic for a plurality of groups; an address comparator; and a multiplexer connected to the address comparator and to the look-up table for providing characteristics for a group responsive to the address. A further exemplary embodiment provides the look-up matrix further comprising non-volatile storage for storing the group characteristics without a spare area. Another exemplary embodiment provides that each of the plurality of memory cells has the same number of logic levels.

An exemplary method of driving a memory device is provided, the method comprising: organizing a plurality of memory cells into a plurality of groups; storing characteristics for each group in a look-up matrix; providing control parameters for each of the plurality of groups, where the control parameters for each group are responsive to its stored characteristics; and driving each memory cell in accordance with its provided control parameters.

Another exemplary embodiment method provides each of the plurality of groups having characteristics differing with location of the group within the structure of the device. Another exemplary embodiment further comprises electronically testing a representative sample of the device; and assigning characteristics for each of the plurality of groups in accordance with results of the electronic testing. Another exemplary embodiment further comprises retrieving the characteristics from a spare area of the memory device; and storing the characteristics in the look-up matrix. Another exemplary embodiment further comprises storing the group characteristics in the look-up matrix, wherein the look-up matrix has nonvolatile memory.

Yet another exemplary embodiment method provides that the characteristics for each group include at least one of program conditions, read conditions, or erase conditions. Another exemplary embodiment provides that the program conditions include at least one of an incremental step pulse programming voltage, a start voltage, a program control voltage, a maximum number of loops, a one-cycle program time, or a verification voltage for each state. Another exemplary embodiment provides that the read conditions include at least one of a select read voltage, a read control voltage, or a one-cycle read time. Another exemplary embodiment provides that the erase conditions include at least one of an erase voltage or an erase time.

Another exemplary embodiment method provides that a range of at least one control parameter for each group is different from a range of the at least one control parameter for each other group. Another exemplary embodiment provides that the memory cells are NAND flash memory cells. Another exemplary embodiment provides that the control parameters include at least one loop program voltage applied to a page of NAND flash memory. Another exemplary embodiment provides that the control parameters include at least one loop read voltage applied to a page of NAND flash memory. Another exemplary embodiment provides that the control parameters include at least one erase voltage applied to a block of NAND flash memory.

Still another exemplary embodiment method provides that the memory cells are nonvolatile. Another exemplary embodiment provides that the plurality of memory cells include at least two layers of memory cells, and the stored characteristics and provided control parameters are different for each layer.

Another exemplary embodiment provides that the memory cells are NAND flash memory and each group is a memory block, the method further comprising: comparing the page address of a memory cell to be accessed with the block address for a group; selecting the characteristics for the group that includes the page address; and using the control parameters, including at least a voltage level and a timing period, that correspond to the selected group characteristics. A further exemplary embodiment provides that each of the plurality of memory cells has the same number of logic levels.

The present disclosure will be further understood from the following description of exemplary embodiments, which is to be read in connection with the accompanying drawings.

BRIEF DESCRIPTION OF THE DRAWINGS

The present disclosure provides multilayered nonvolatile semiconductor memory devices with adaptive control schemes in accordance with the following exemplary figures, in which.

DETAILED DESCRIPTION OF PREFERRED EMBODIMENTS

Systems controlled by computers or microprocessors typically use Electrically Erasable Programmable Read-Only Memory (EEPROM) devices, which preferably have high density, high performance, and occupy increasingly smaller areas. In order to obtain larger-capacity NAND flash memory devices, a method of stacking memory cell arrays is in development. Three dimensional (3D) memory arrays comprise two or more layers of memory material, each layer of memory material having an array of memory cells.

There is a tendency for the threshold voltage distribution profile of memory cells to grow wider as the structure of memory cell is made multi-layered. For example, the component threshold voltage distribution profiles may be different between the threshold voltage distribution profiles of memory cells in a first layer versus those in a second layer.

The present disclosure provides a method for driving a memory cell under an optimized operating condition implementing a control scheme, where the control scheme divides a memory cell array into a plurality of predetermined groups. An exemplary nonvolatile memory device to be driven and controlled may have at least two memory cells having characteristics varying with structural shape or position, a lookup matrix for storing the information about characteristics block group sets and transferring the data in accordance with an address signal, and a state machine for controlling an optimized operating condition for the respective memory cells based on the characteristic information of the respective block group set.

Figure 1:
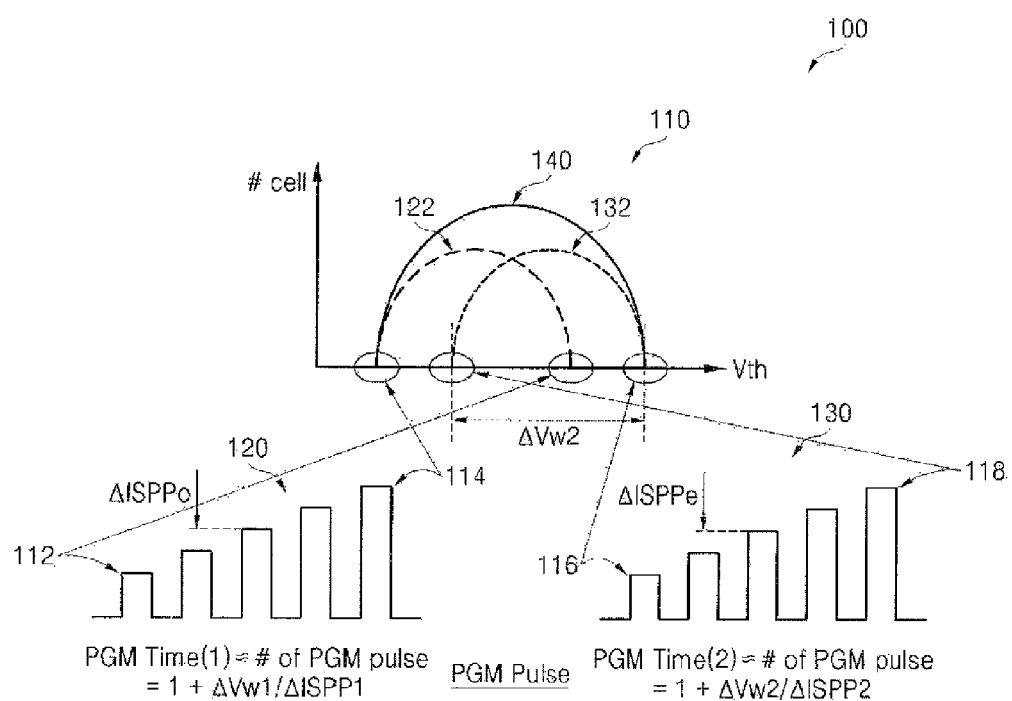
FIG. 1 shows a schematic graphical diagram of a program (PGM) pulse for a multilayered nonvolatile semiconductor memory device in accordance with an exemplary embodiment of the present disclosure.

As shown in FIG. 1, a program (PGM) pulse for a multilayered nonvolatile semiconductor memory device is indicated generally by the reference numeral 100. The program pulse 100 has a cell number versus threshold voltage characteristic 110, which is plotted as a function of cell number (# cell) on the vertical axis versus threshold voltage (Vth) on the horizontal axis. The pulse 100 includes a first layer step-wise programming voltage (Vpgm) 120, and a second layer step-wise Vpgm 130. The first and second layer programming voltages are plotted as a function of voltage on the vertical axis versus time on the horizontal axis. The first layer Vpgm 120 has a start voltage level 112 and a stop voltage level 114, with a first inter-step increment of $\Delta$ISPPo. The second layer Vpgm 130 has a start voltage level 116 and a stop voltage level 118, with a second inter-step increment of ΔISPPe. Thus, the first layer Vpgm 120 has a first cell number versus Vth characteristic 122, and the second layer Vpgm 130 has a second cell number versus Vth characteristic 132. The sum of the first and second characteristics is a third cell number versus Vth characteristic 140.

Figure 2:
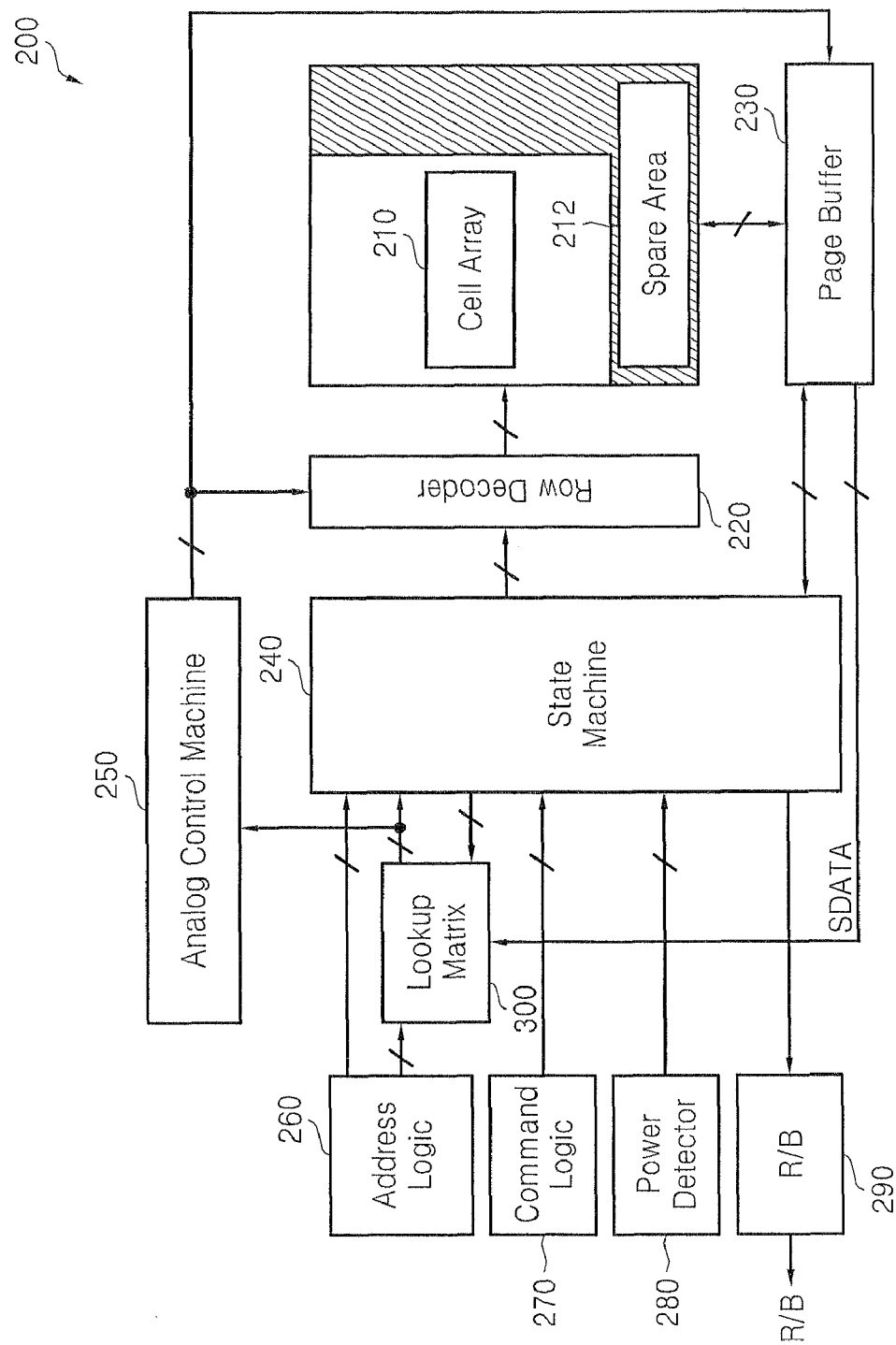
FIG. 2 shows a schematic block diagram of a first embodiment multilayered nonvolatile semiconductor memory device in accordance with an exemplary embodiment of the present disclosure.

Turning to FIG. 2, a first embodiment multilayered non-volatile semiconductor memory device is indicated generally by the reference numeral 200. The memory device 200 includes a cell array 210 having a spare area 212, a row decoder 220 connected to the cell array, a page buffer 230 connected to the cell array, a periodic state machine 240 connected to the page buffer and the row decoder, an analog control machine 250 connected to the periodic state machine, page buffer and row decoder, address logic 260 connected to the periodic state machine, command logic 270 connected to the periodic state machine, a power detector 280 connected to the periodic state machine, a ready/busy (R/B) unit 290 connected to the periodic state machine for outputting a R/B signal, and a lookup matrix 300. Here, the lookup matrix 300 is connected to the address logic 260, the analog control machine 250, the periodic state machine 240 and the page buffer 230 for receiving specific signal data (SDATA) from the page buffer and providing lookup data to the analog control machine and the periodic state machine.

The SDATA may comprise structural information, such as line width, tested information, such as line capacitance or time to stabilize, and like information or characteristics for one or more specific memory cells. Preferably, the SDATA is different for a first layer and a second layer of memory cell arrays, and/or for odd and even numbered blocks of memory cells.

In operation of the first embodiment memory device 200, the spare area 212 contains non-volatile advanced information regarding respective block groups for program, read and erase operating conditions. When the memory device 200 powers up, the information is transferred from the spare area 212 to the lookup matrix 300. The state machine 240 controls optimized operating conditions for the respective memory blocks of the cell array 210 based on the data from the lookup matrix 300.

Figure 3:
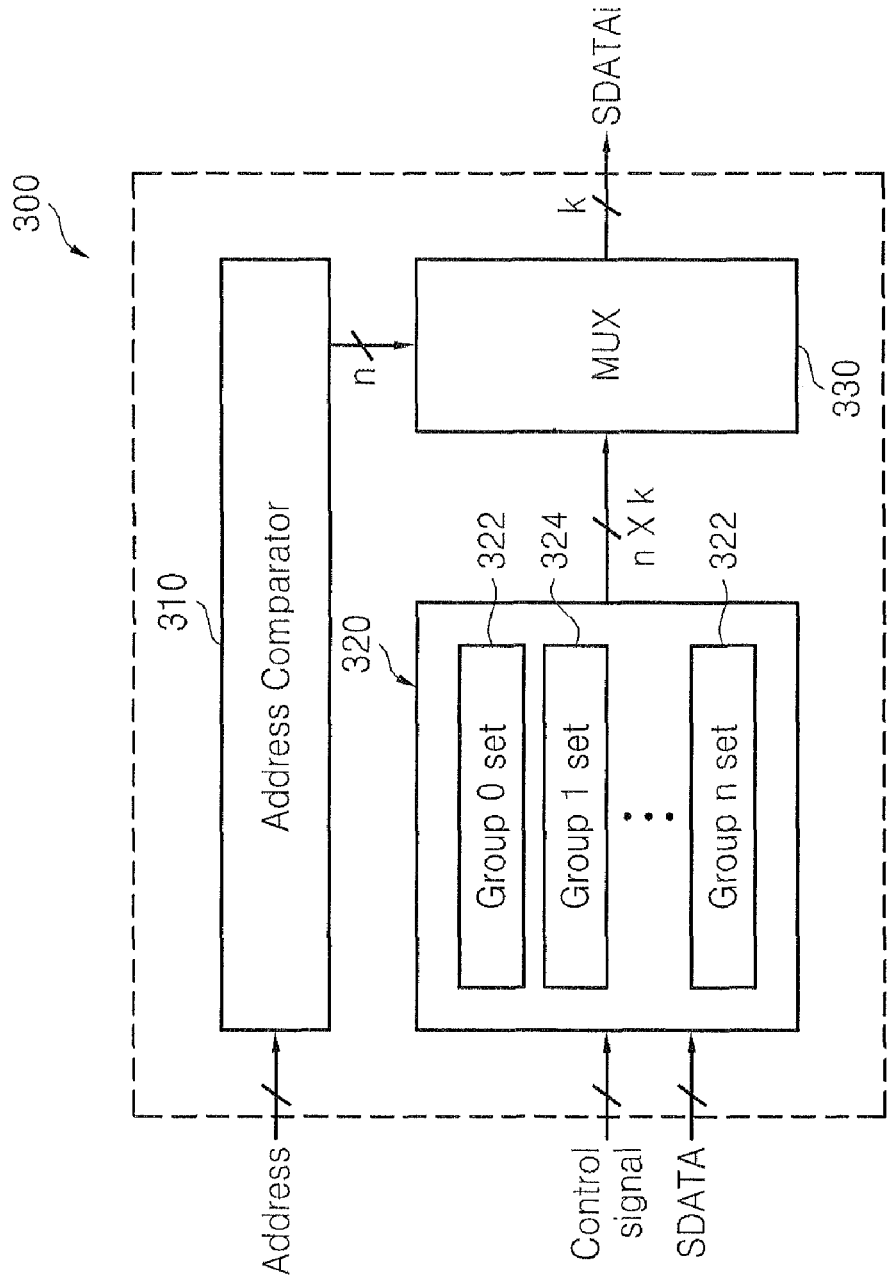
FIG. 3 shows a schematic block diagram of the lookup matrix of FIG. 2 in greater detail, in accordance with an exemplary embodiment of the present disclosure.

Turning now to FIG. 3, the lookup matrix 300 of FIG. 2 is shown in greater detail. The lookup matrix 300 includes an address comparator 310 for receiving an address signal from the address logic 260 of FIG. 2, a lookup table 320 for receiving a control signal from the state machine 240 and SDATA from the page buffer 230, both of FIG. 2, and an N-to-1 multiplexer (mux) 330 connected to the address comparator and the lookup table for receiving n-bit address and n-by-k bit lookup signals to output k-bit SDATAi to the analog control machine 250 and/or the periodic state machine 240, each of FIG. 2. Here, the lookup table 320 includes a Block Group 0 set 322, a Block Group 1 set 324, up to a Block Group n set 328. Preferably, a register, latch, or the like may be used to store data from the block group n sets. SDATAi is defined as the signal of the respective Block Group set information for the respective memory block group upon optimized operating conditions. The lookup matrix 300 of the first embodiment may be implemented in volatile RAM.

Figure 4:
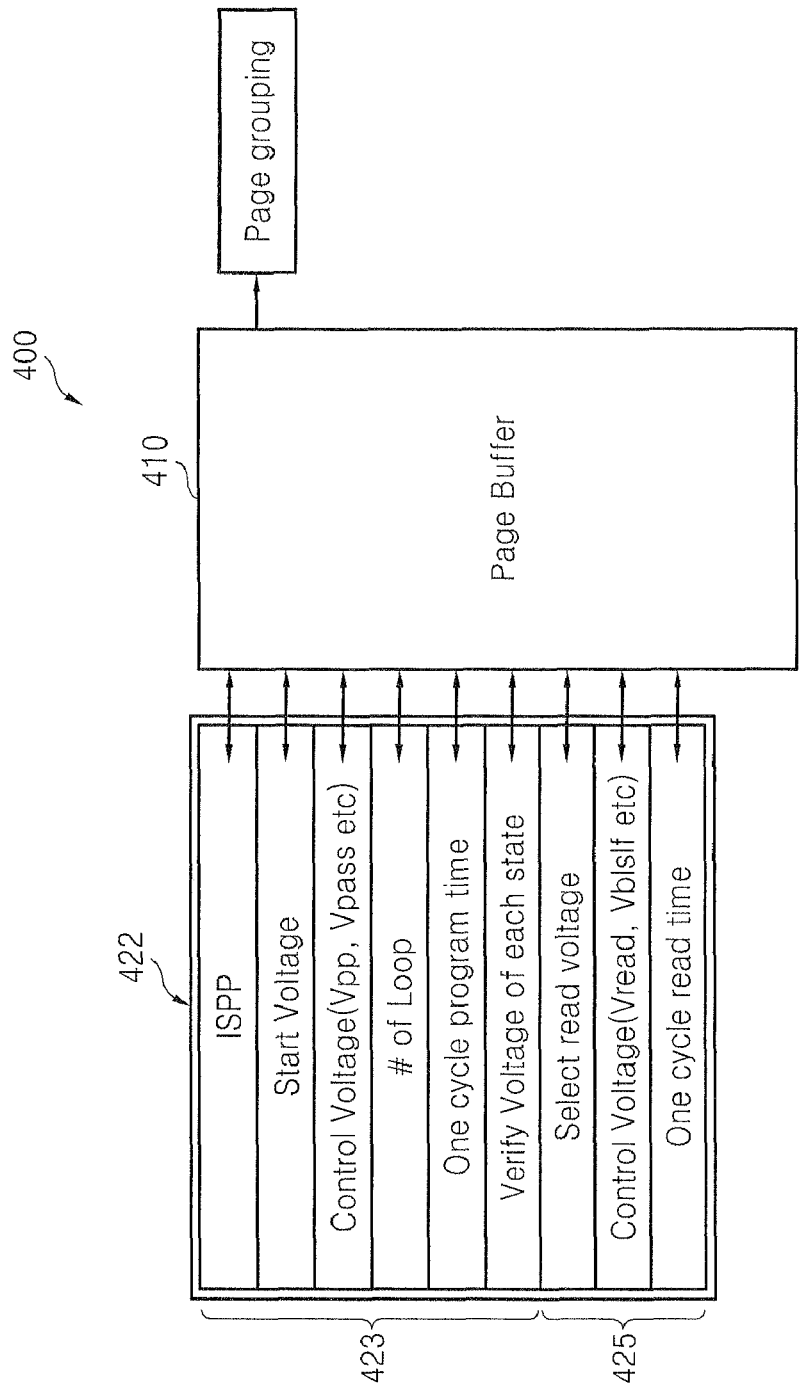
FIG. 4 shows a schematic block diagram of a block group set implementation in accordance with an exemplary embodiment of the present disclosure.

As shown in FIG. 4, a Block Group set implementation is indicated generally by the reference numeral 400. The implementation includes a Block Group set 422 connected to a periodic state machine and/or page buffer 410, which outputs page grouping information. The Block Group set 422 includes program conditions 423 and read conditions 425. In alternate embodiments, the Block Group set may further include separate erase conditions.

The program conditions 423 may include incremental step pulse programming (ISPP), start voltage, control voltage (e.g., Vpp, Vpass), number of loops, single cycle program time, verify voltage for each state, and like information. The read conditions 425 may include select read voltage, control voltage (e.g., Vread, Vblslf), single cycle read time, and like information.

The Block Group sets and spare areas may store SDATA for memory cells of the cell array 240 of FIG. 2, for example, upon the optimized operating conditions. The operating conditions include program/read/erase conditions such as a word line voltage, bit line voltage, well voltage, and time requirements thereof. If the information is only characteristic of program/read operating conditions, the control scheme may divide a memory cell array into a plurality of predetermined pages. If the information is characteristic of program/read/erase operating conditions, the control scheme may divide a memory cell array into a plurality of predetermined blocks.

Figure 5:
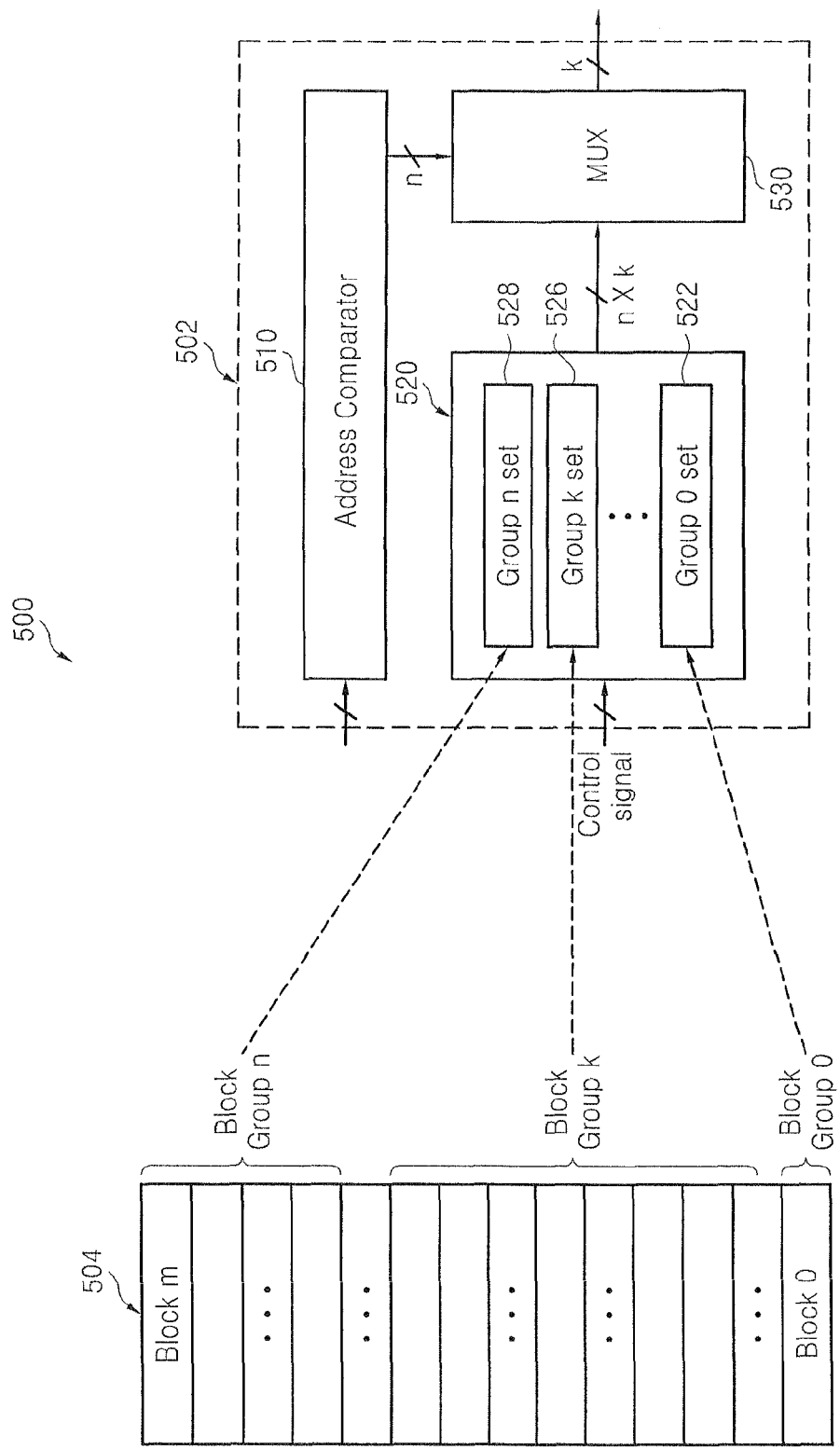
FIG. 5 shows a schematic block diagram of a lookup matrix with block groups in accordance with an exemplary embodiment of the present disclosure.

Turning to FIG. 5, a lookup matrix with block groups is indicated generally by the reference numeral 500. Here, the matrix with block groups includes a lookup matrix 502 disposed for receiving blocks 504 from a state machine. The blocks 504 are numbered from 0 through m, which are here divided into block groups 0, k and n.

The matrix 502 includes an address comparator 510 for receiving an address signal, a lookup table 520 for receiving a control signal and Block Group SDATA, and an N-to-1 multiplexer 530 connected to the address comparator and the lookup table for receiving n-bit address and n-by-k bit lookup signals to output k-bit data. Here, the lookup table 320 includes a Block Group 0 set 522, a Block Group k set 526, up to a Block Group n set 528.

In operation of this lookup table embodiment, SDATA is stored in the lookup table 520 by a periodic state machine. Here, the Block Group sets may be predetermined by a semiconductor manufacturer following the manufacture and testing of a representative and/or particular semiconductor chip. In alternate embodiments, the block group sets and/or the particular characteristics thereof may be determined adaptively by the memory device itself.

Figure 6:
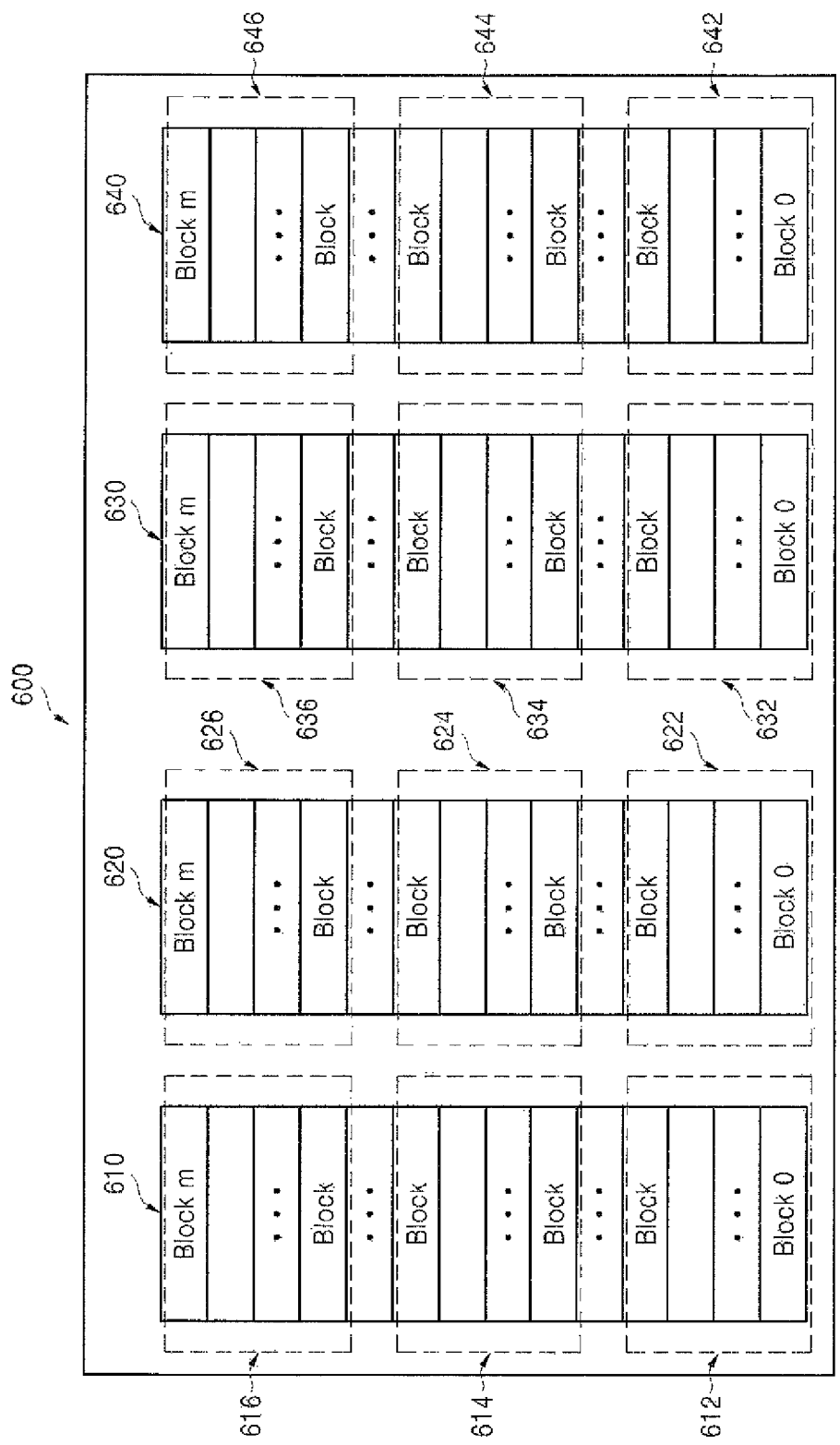
FIG. 6 shows a schematic block diagram of a first block grouping example in accordance with an exemplary embodiment of the present disclosure.

Turning now to FIG. 6, a first block grouping example is indicated generally by the reference numeral 600. The block grouping 600 includes block groups 612, 614 and 616 in a first layer matrix 0, block groups 622, 624 and 626 in a second layer matrix 0, block groups 632, 634 and 636 in a first layer matrix 1, and block groups 642, 644 and 646 in a second layer matrix 1. Here, each span of 0 to m blocks is divided into three block groups.

Figure 7:
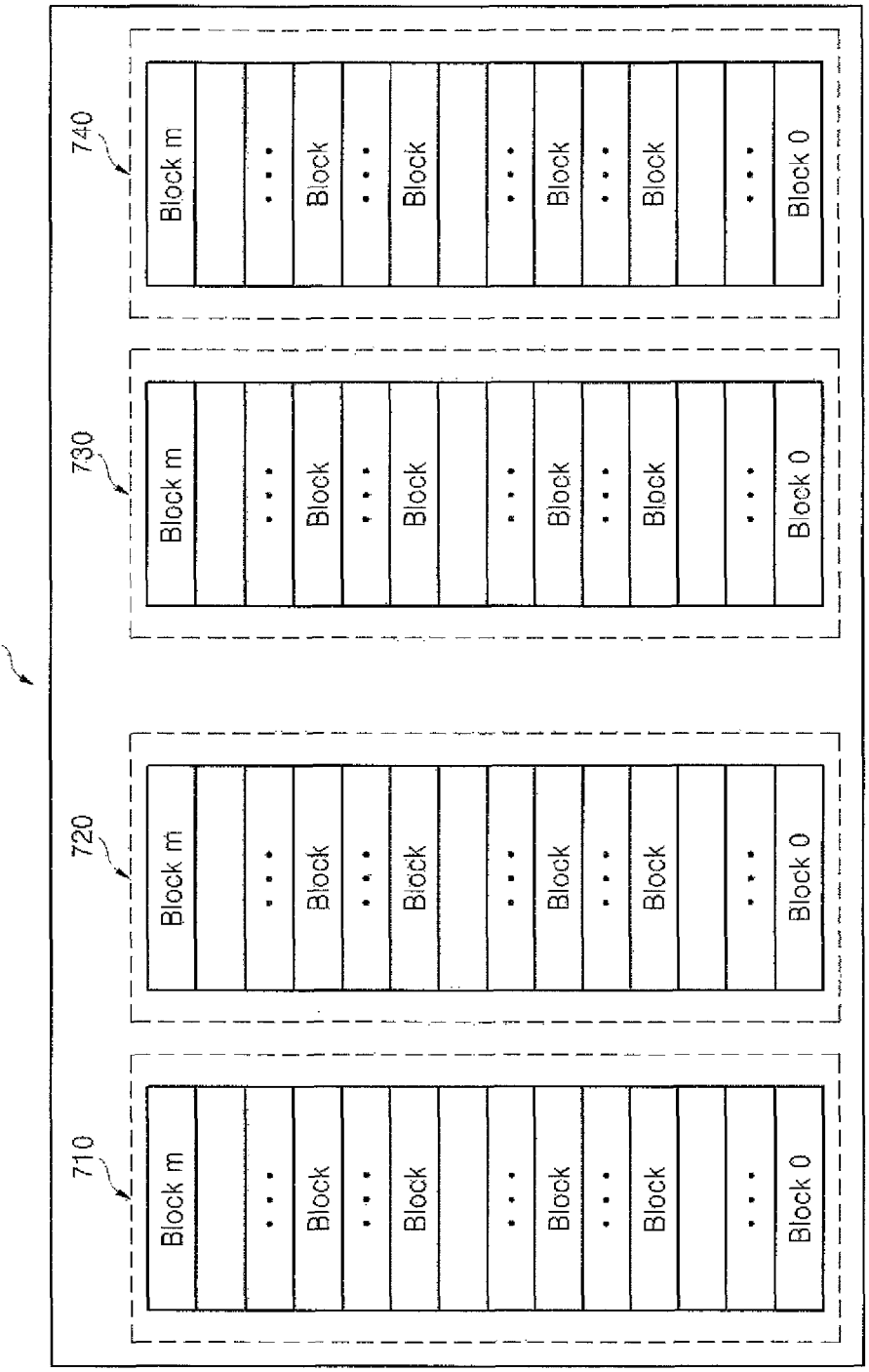
FIG. 7 shows a schematic block diagram of a second block grouping example in accordance with an exemplary embodiment of the present disclosure.

As shown in FIG. 7, a second block grouping example is indicated generally by the reference numeral 700. The block grouping 700 includes a block group 710 in a first layer matrix 0, a block group 720 in a second layer matrix 0, a block group 730 in a first layer matrix 1, and a block group 740 in a second layer matrix 1. Here, each span of 0 to m blocks is a single block group.

Figure 8:
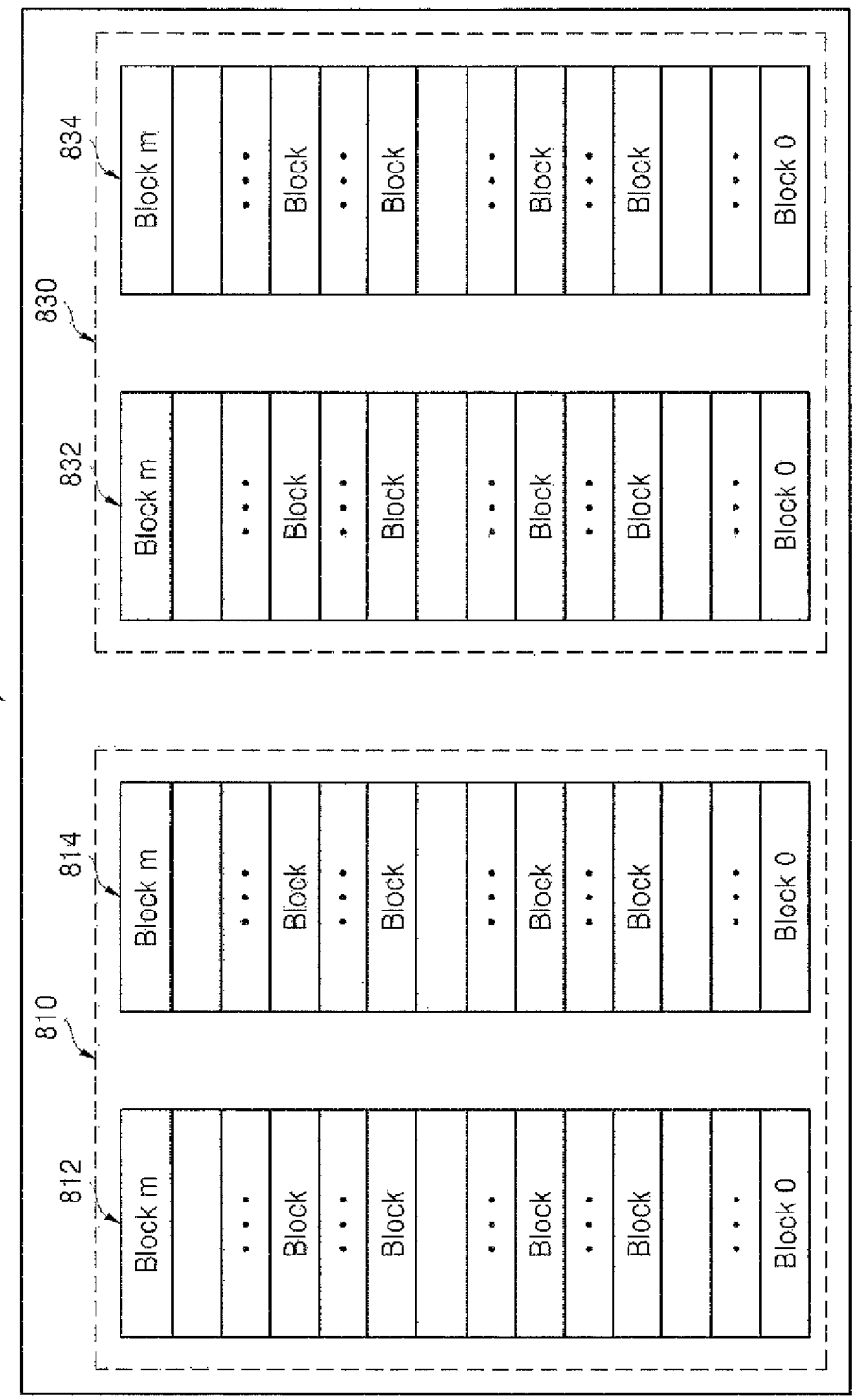
FIG. 8 shows a schematic block diagram of a third block grouping example in accordance with an exemplary embodiment of the present disclosure.

Turning to FIG. 8, a third block grouping example is indicated generally by the reference numeral 800. The block grouping 800 includes a block group 810 including a first layer matrix 0, denoted 812, and a second layer matrix 0, denoted 814; and a block group 830 including a first layer matrix 1, denoted 832, and a second layer matrix 1, denoted 834. That is, each block group includes two spans of 0 to m blocks for the same matrix in a single block group.

Figure 9:
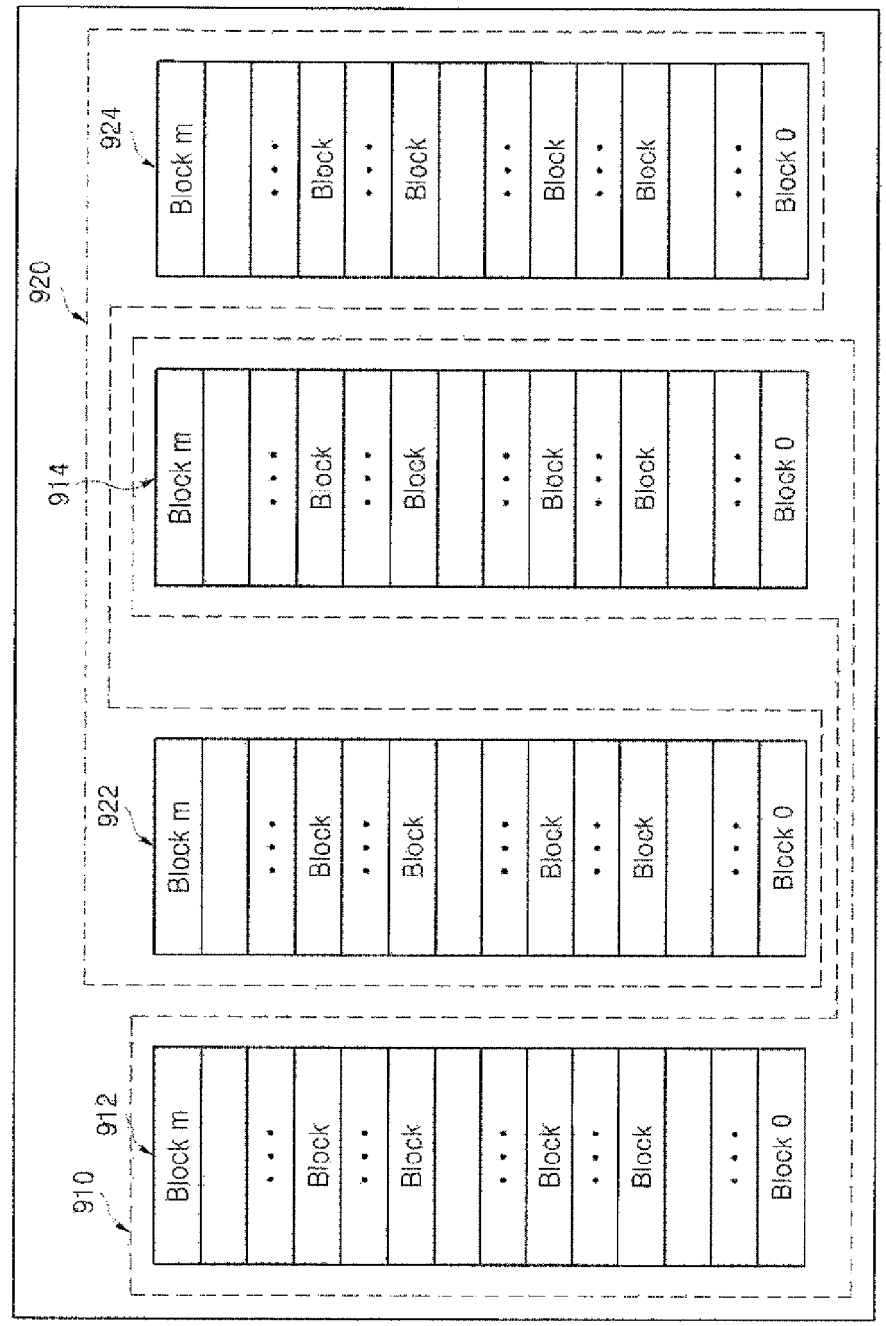
FIG. 9 shows a schematic block diagram of a fourth block grouping example in accordance with an exemplary embodiment of the present disclosure.

Turning now to FIG. 9, a fourth block grouping example is indicated generally by the reference numeral 900. The block grouping 900 includes a block group 910 including a first layer matrix 0, denoted 912, and a first layer matrix 1, denoted 914; and a block group 920 including a second layer matrix 0, denoted 922, and a second layer matrix 1, denoted 924. That is, each block group includes two spans of 0 to m blocks for the same layer in a single block group.

Figure 10:
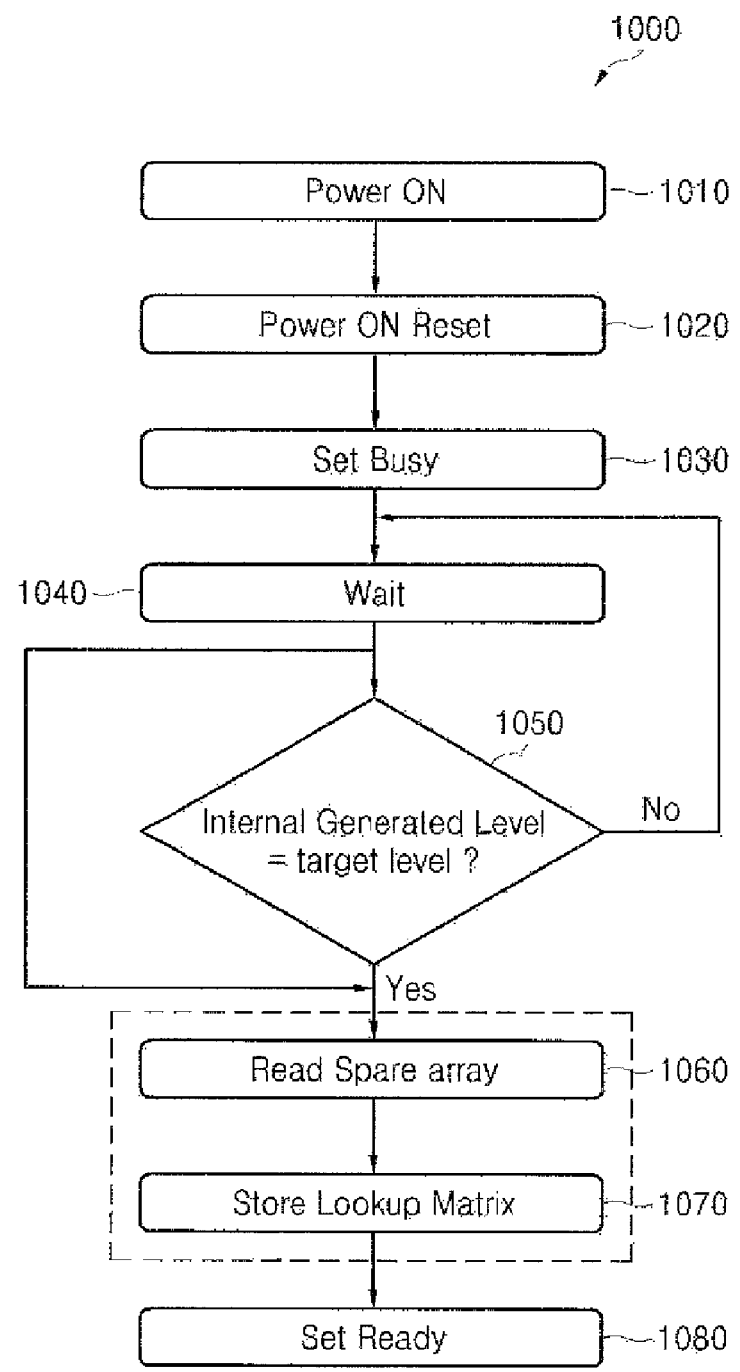
FIG. 10 shows a schematic flow diagram of a control method for lookup matrix setup in accordance with an exemplary embodiment of the present disclosure.

As shown in FIG. 10, a control method for lookup matrix setup is indicated generally by the reference numeral 1000. Here, a function block 1010 to perform a power on sequence passes control to a function block 1020 to perform a power on reset, which passes control to a function block 1030 to set the busy status, which, in turn, passes control to a wait block 1040. The wait block 1040 passes control to a decision block 1050, which determines whether the internally generated voltage level is equal to the target level. If not, the decision block passes control back to the wait block 1040. But, if so, the decision block passes control to a function block 1060 to read data from the spare array. The block 1050 may stabilize Vcc, for example. The function block 1060, in turn, passes control to a function block 1070 to store the read data in the lookup matrix. The function block 1070 passes control to a function block 1080, which sets the ready status.

In operation, when power is turned on, a memory device performs a power on reset sequence, and a busy signal of the memory device moves it to a 'Set Busy' state. After a 'Wait' state, it determines whether Internal Generated Level has reached the target level. If the Generated level has reached the target level, SDATA is transferred from the spare area and stored in the lookup matrix. Afterwards, the busy signal is deactivated and the device moves to the ready state.

Figure 11:
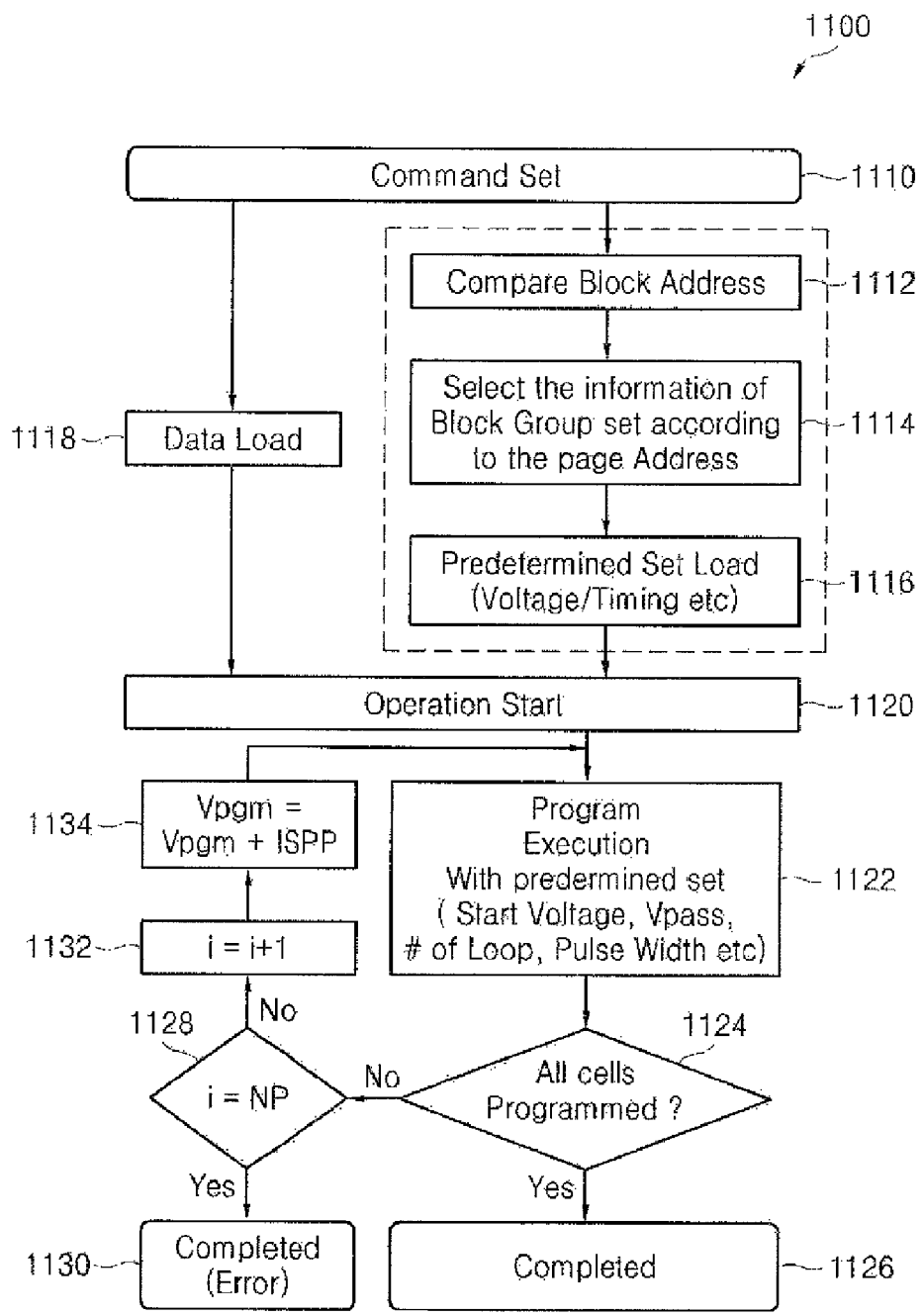
FIG. 11 shows a schematic flow diagram of a memory cell programming method in accordance with an exemplary embodiment of the present disclosure.

Turning to FIG. 11, a memory cell programming method is indicated generally by the reference numeral 1100. A function block 1110 performs a command set and passes control to parallel function blocks 1112 and 1118. The function block 1112 compares the block address and passes control to a function block 1114. The function block 1114 selects the information for the respective Block Group set according to the page address, for example, and passes control to a function block 1116. The function block 1116, in turn, implements the predetermined set load, such as voltage, timing, and the like, and passes control to a function block 1120. Meanwhile, the parallel function block 1118 performs a data load and passes control to the function block 1120. When both function blocks 1116 and 1118 have passed control to function block 1120, the function block 1120 becomes enabled and executes an operation start.

Next, the function block 1120 passes control to a function block 1122, which performs program execution with the predetermined set including start voltage, Vpass, number of loops, pulse width and the like. The function block 1122 passes control to a decision block 1124, which determines whether all cells have been programmed. If so, the decision block 1124 passes control to a function block 1126, which indicates a successful completion. If not, the decision block 1124 passes control to another decision block 1128, which determines whether the loop counter i has reached the value NP, which indicates the maximum number of loops. If so, the decision block 1128 passes control to a function block 1130, which indicates a completion with error. If not, the decision block 1128 passes control to a function block 1132, which increments the loop counter i by one and passes control to a function block 1134. The function block 1134, in turn, increments Vpgm by ISPP, and passes control to the function block 1122.

Figure 12:
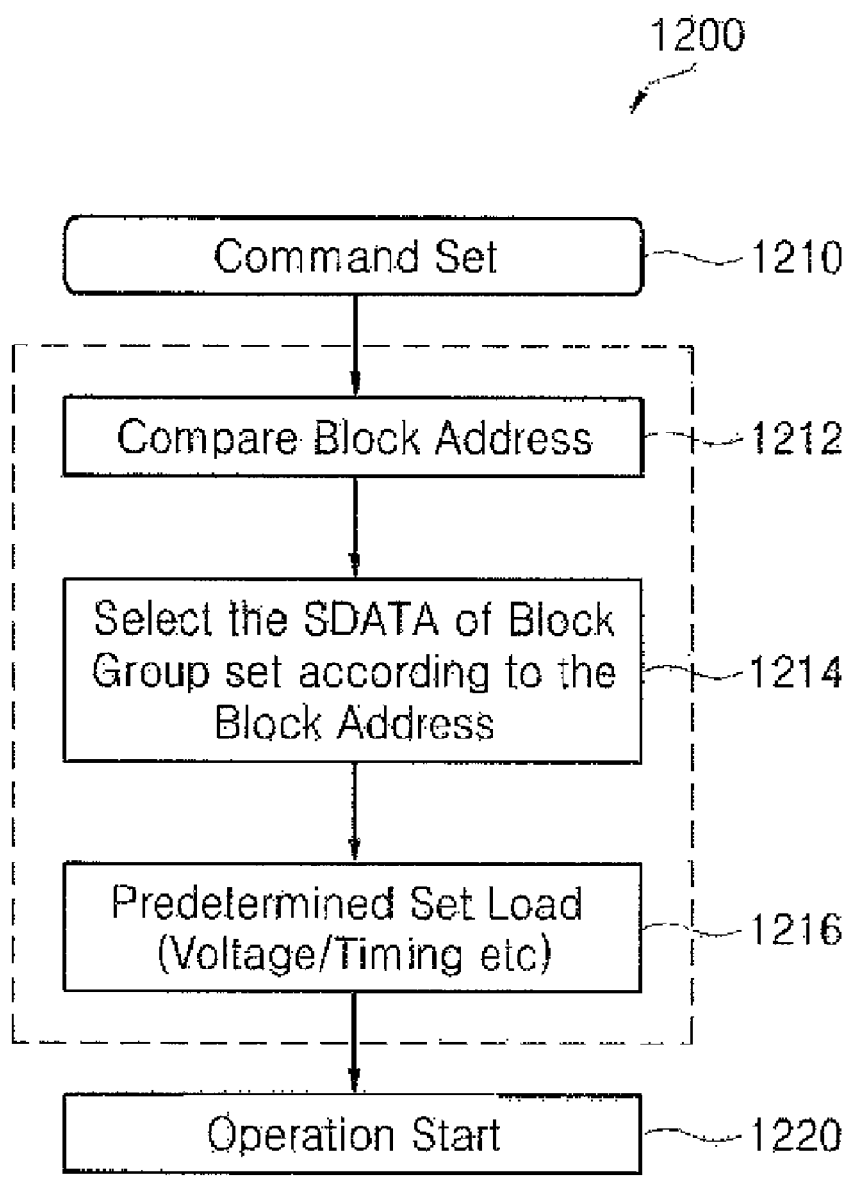
FIG. 12 shows a schematic flow diagram of a memory cell erase method in accordance with an exemplary embodiment of the present disclosure.

Turning now to FIG. 12, a memory cell erase method is indicated generally by the reference numeral 1200. The memory cell erase method 1200 is similar to the memory cell programming method 1100 of FIG. 11, so duplicate graphics and description may be omitted. The memory cell erase method 1200 includes a function block 1210, which performs a command set and passes control to a function block 1212. The function block 1112 compares the block address and passes control to a function block 1214. The function block 1214 selects the SDATA for the respective Block Group set according to the block address, for example, and passes control to a function block 1216. The function block 1216, in turn, implements the predetermined set load, such as voltage, timing, and the like, and passes control to a function block 1220.

Figure 13:
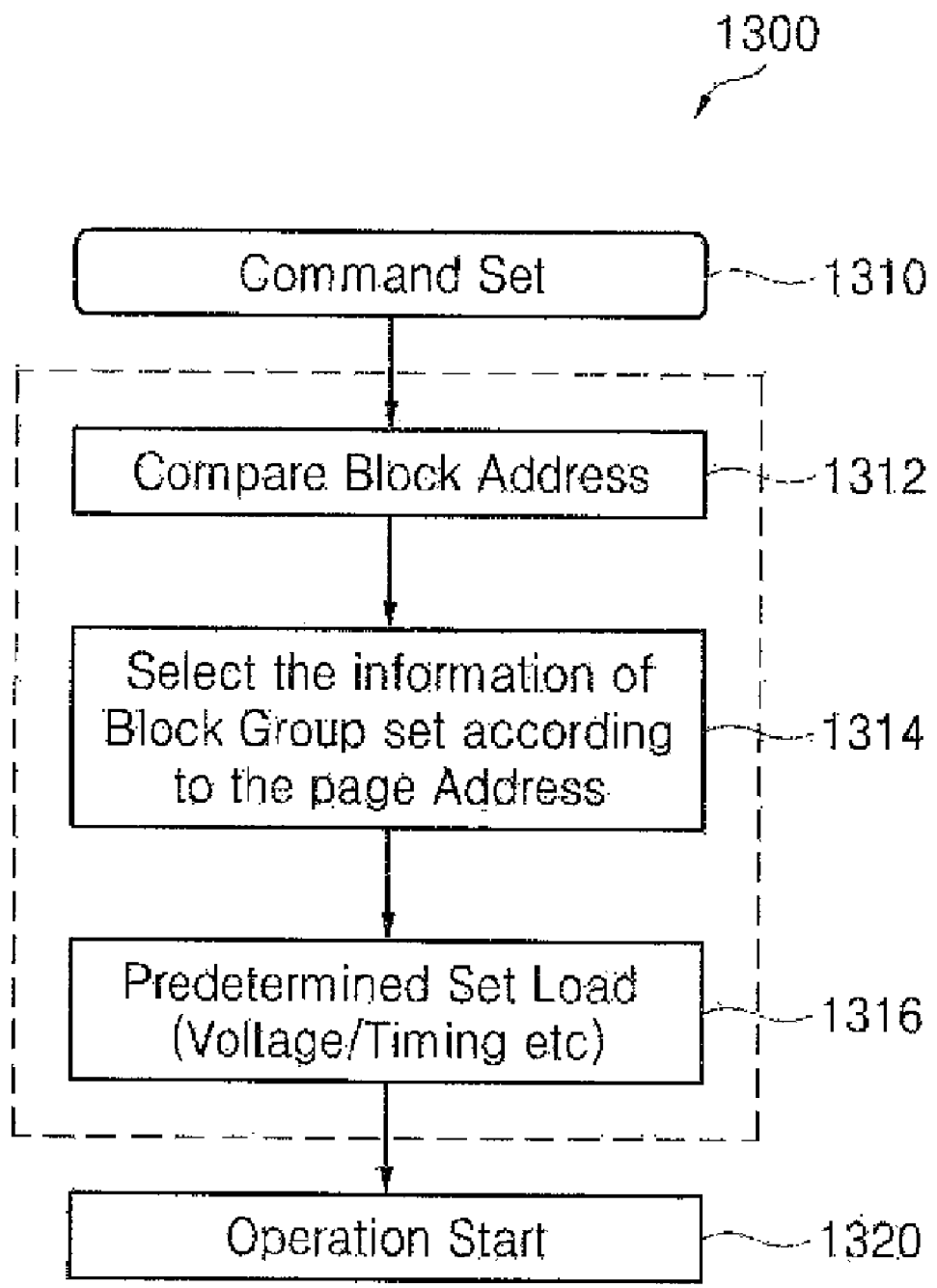
FIG. 13 shows a schematic flow diagram of a memory cell read method in accordance with an exemplary embodiment of the present disclosure.

As shown in FIG. 13, a memory cell read method is indicated generally by the reference numeral 1300. The memory cell read method 1200 is similar to the memory cell programming and erase methods 1100 and 1200 of FIGS. 11 and 12, respectively, so duplicate graphics and description may be omitted. In the memory cell read method 1300, a function block 1310 performs a command set and passes control to a function block 1312. The function block 1312 compares the block address and passes control to a function block 1314. The function block 1314 selects the information for the respective Block Group set according to the page address, for example, and passes control to a function block 1316. The function block 1316, in turn, implements the predetermined set load, such as voltage, timing, and the like, and passes control to a function block 1320.

Figure 14:
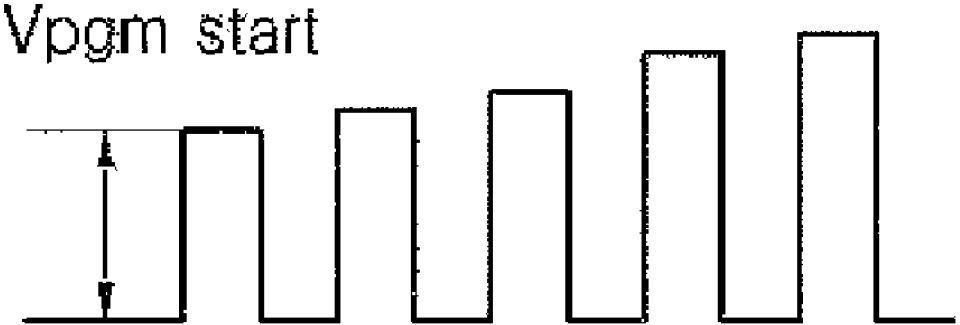
FIG. 14 shows a schematic graphical diagram of an incremental step pulse programming (ISPP) signal in accordance with an exemplary embodiment of the present disclosure.

Turning to FIG. 14, an incremental step pulse programming (ISPP) signal is indicated generally by the reference numeral 1400. The ISPP signal is plotted as a function of voltage on the vertical axis versus time on the horizontal axis. The ISPP signal is a pulsed signal that varies between ground and an increasing maximum voltage. The maximum voltage for the first pulse is the voltage potential Vpgm_start, and each subsequent pulse is increased by a delta_ISPP voltage step until the maximum number of loops (NP) has been reached.

Figure 15:
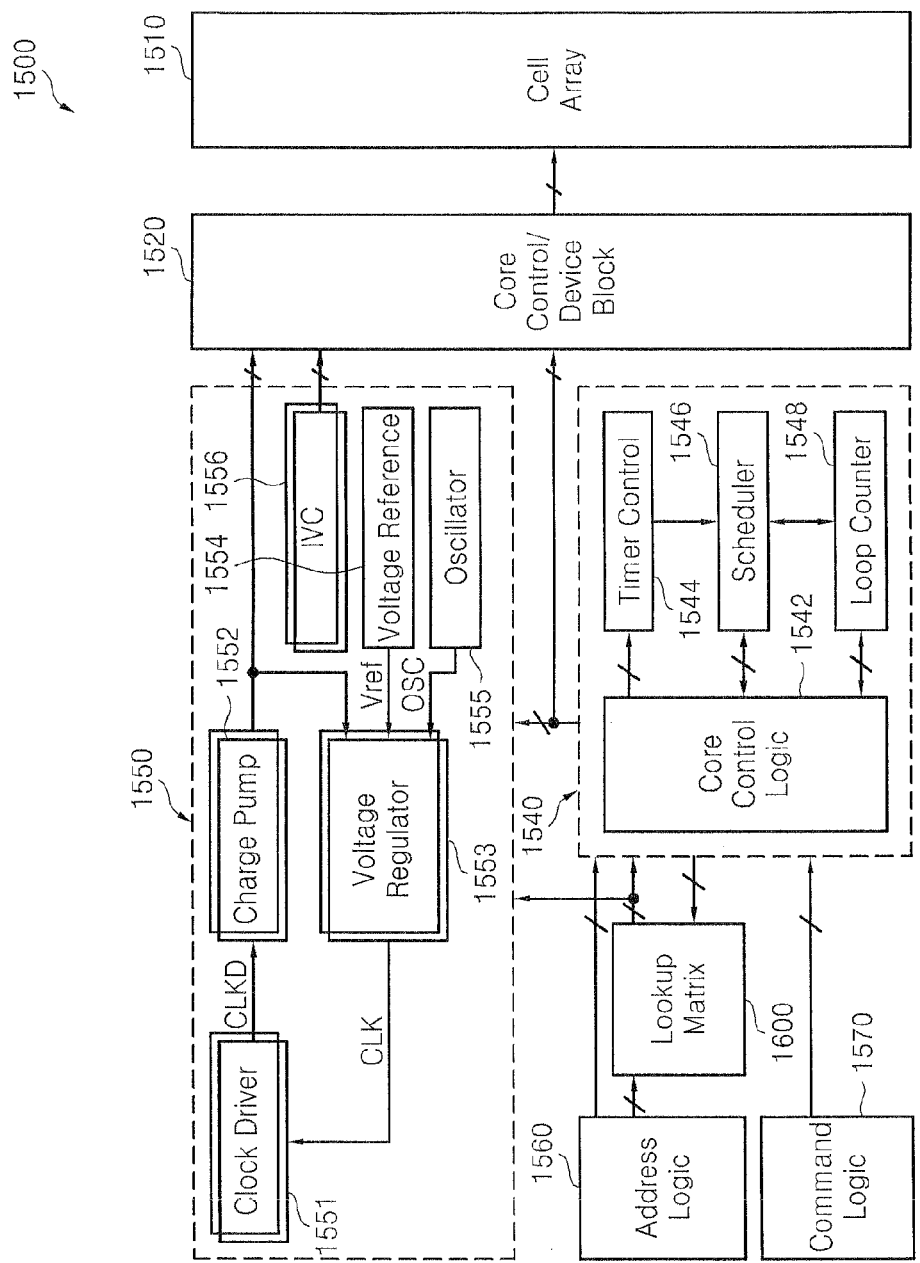
FIG. 15 shows a schematic block diagram of a second embodiment multilayered nonvolatile semiconductor memory device in accordance with an exemplary embodiment of the present disclosure.

Turning now to FIG. 15, a second embodiment multilayered nonvolatile semiconductor memory device is indicated generally by the reference numeral 1500. The memory device 1500 includes a cell array 1510, which need not have a spare area, a core control/device block 1520 connected to the cell array, a periodic state machine 1540 connected to the core control/device block, an analog control machine 1550 connected to the periodic state machine and the core control/device block, address logic 1560 connected to the periodic state machine, command logic 1570 connected to the periodic state machine, and a lookup matrix 1600. Here, the lookup matrix 1600 is connected to the address logic 1560, the analog control machine 1550, and the periodic state machine 1540 for providing lookup data to the analog control machine and the periodic state machine.

The periodic state machine 1540 includes core control logic 1542 connected to a timer control 1544. The timer control is connected to a scheduler 1546. The scheduler, in turn, is connected to both the core control logic and a loop counter 1548, which is also connected to the core control logic.

The analog control machine 1550 includes a clock driver 1551 connected to a charge pump 1552 for providing a CLKD signal to the charge pump. The charge pump provides increased voltage to a voltage regulator 1553, and an output to the core control/driver block 1520. The voltage regulator is connected between the charge pump and the clock driver for providing a CLK signal to the clock driver. A voltage reference 1554 provides a Vref signal to the voltage regulator, and an oscillator provides an OSC signal to the voltage regulator. An indirect vector control (IVC) unit 1556 provides another output to the core control/driver block 1520.

The lookup data may include SDATA with structural information, such as line width, tested information, such as line capacitance or time to stabilize, and like information or characteristics for one or more specific memory cells. Preferably, the SDATA is different for a first layer and a second layer of memory cell arrays, and/or for odd and even numbered blocks of memory cells.

In operation of the second embodiment memory device 1500, the lookup matrix is itself implemented in non-volatile or flash memory, so it does not require start-up information from a spare area. This is in contrast to the embodiment 200 of FIG. 2. The state machine 1540 controls optimized operating conditions for the respective memory blocks of the cell array 1510 based on the data from the lookup matrix 1600.

Figure 16:
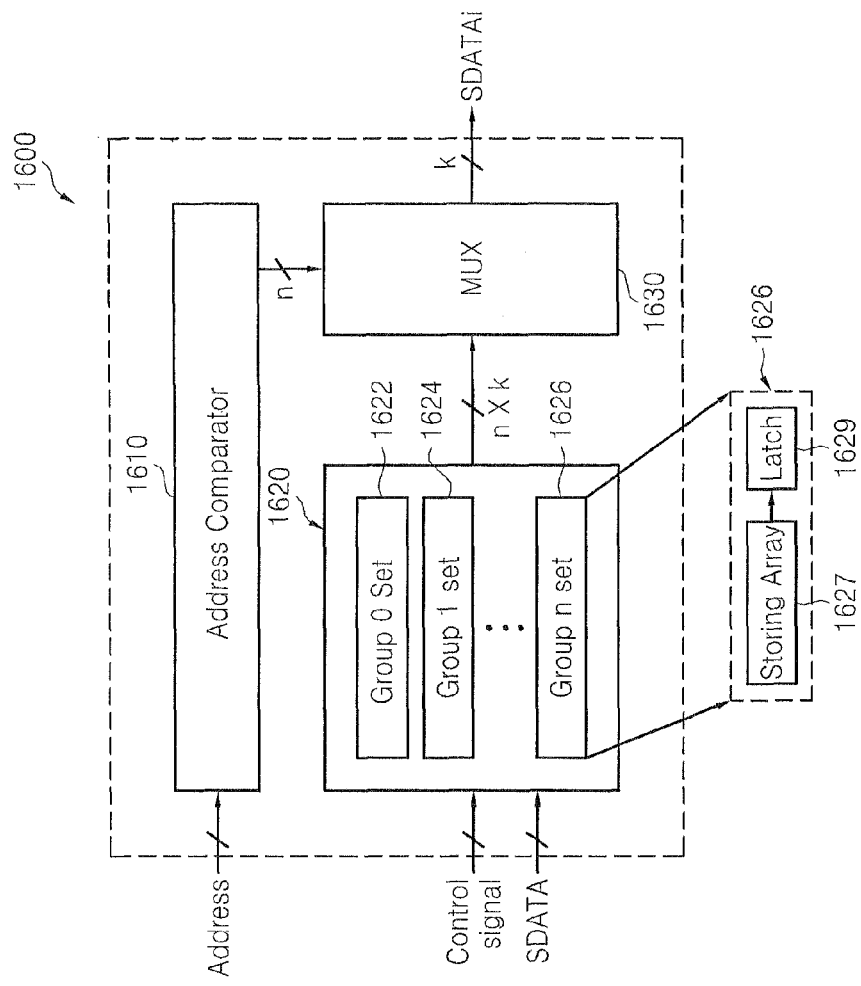
FIG. 16 shows a schematic block diagram of the lookup matrix of FIG. 15 in greater detail, in accordance with an exemplary embodiment of the present disclosure.

As shown in FIG. 16, the lookup matrix 1600 of FIG. 15 is shown in greater detail. The lookup matrix 1600 includes an address comparator 1610 for receiving an address signal from the address logic 1560 of FIG. 15, a lookup table 1620 for receiving a control signal from the state machine 1540 of FIG. 2, and an N-to-1 multiplexer (mux) 1630 connected to the address comparator and the lookup table for receiving n-bit address and n-by-k bit lookup signals to output k-bit SDATAi to the analog control machine 1550 and/or the periodic state machine 1540, each of FIG. 15.

The lookup table 1620 includes a Block Group 0 set 1622, a Block Group 1 set 1624, and up to a Block Group n set 1626. Preferably, a non-volatile type device may be used to store data from the block group sets. Here, each block group set 1622-1626 is stored in non-volatile memory, and includes a storing array 1627 connected to a latch 1629. SDATAi is defined as the signal of the respective Block Group set information for the respective memory block group upon optimized operating conditions.

In operation, the lookup matrix receives an address from the address logic and sends the corresponding Block Group set information to at least one of the analog control machine or the periodic state machine. Since the information is originally stored in the lookup matrix, there is no need for a spare area.

Figure 17:
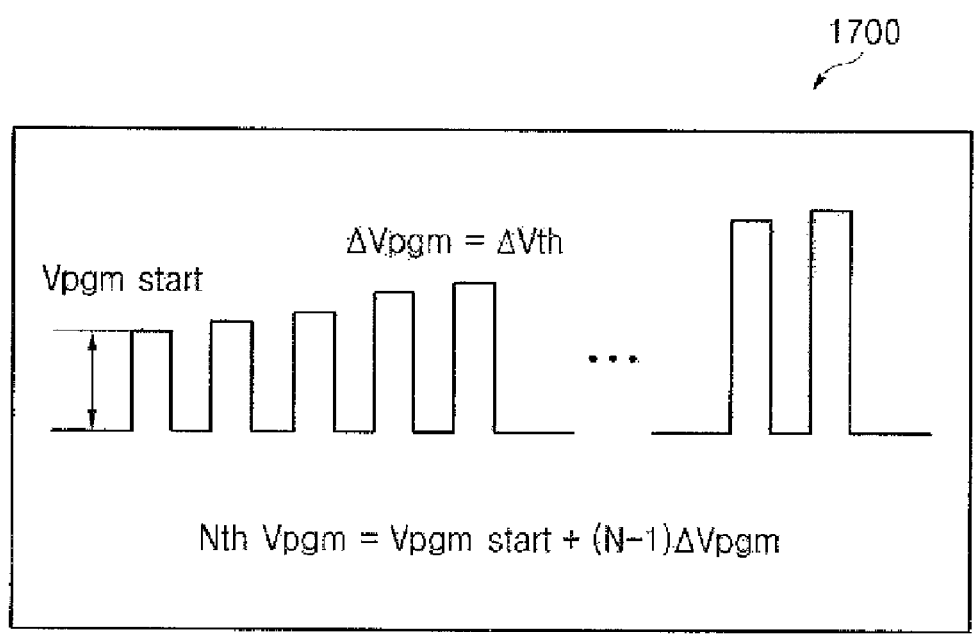
FIG. 17 shows a schematic graphical diagram of an incremental step pulse programming (ISPP) signal in accordance with an exemplary embodiment of the present disclosure.

Turning to FIG. 17, an incremental step pulse programming (ISPP) signal is indicated generally by the reference numeral 1700. The ISPP signal is plotted as a function of voltage on the vertical axis versus time on the horizontal axis. The ISPP signal is a pulsed signal that varies between a minimum and an increasing maximum voltage. The maximum voltage for the first loop is the voltage potential Vpgm_start, and each subsequent loop's pulse is increased by a delta_Vpgm voltage step until the maximum number of loops (NP) has been reached. Here, the delta_Vpgm voltage step is equal to a delta_Vth threshold voltage step. The Nth loop Vpgm voltage is equal to Vpgm_start plus (N-1) times delta_Vpgm.

Figure 18:
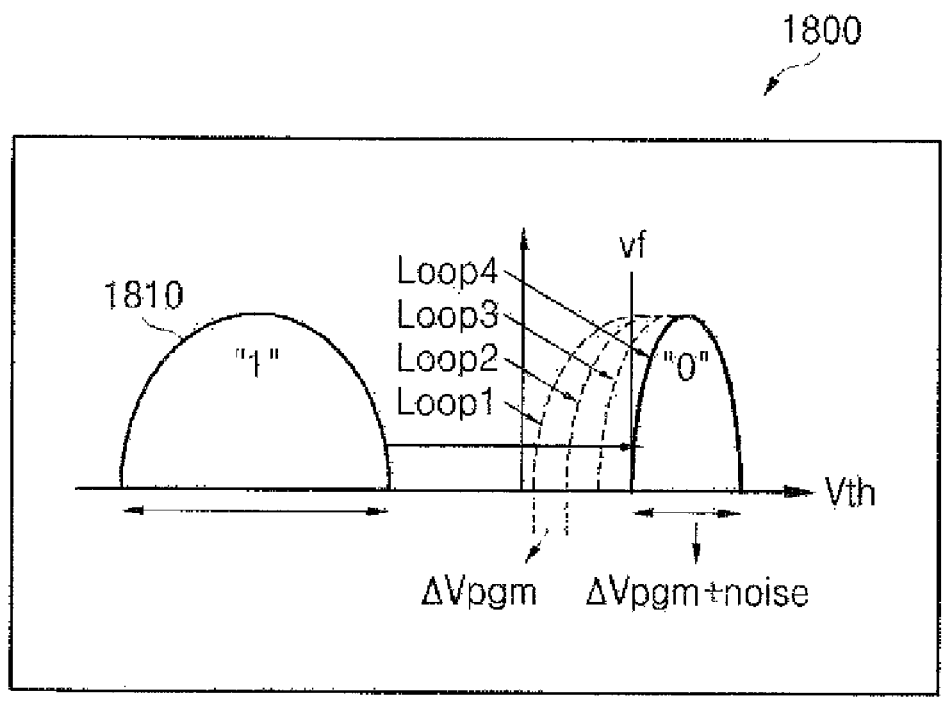
FIG. 18 shows a schematic graphical diagram of the threshold voltage (Vth) distribution resulting from the incremental step pulse programming (ISPP) signal of FIG. 17 in accordance with an exemplary embodiment of the present disclosure.

Turning now to FIG. 18, the threshold voltage (Vth) distribution resulting from the incremental step pulse programming (ISPP) signal 1700 of FIG. 17 is indicated generally by the reference numeral 1800. Here, "1" valued memory cells have a Vth distribution 1810. On the other hand, "0" valued memory cells have a Vth distribution Loop1 after the first loop, Loop2 after the second loop, Loop3 after the third loop, and Loop4 after the last or Nth loop. Each successive loop has a minimum voltage level that exceeds the previous loop's minimum voltage level by delta_Vpgm. After the Nth loop, the voltage distribution of all "0" valued memory cells meets or exceeds a minimum fine voltage (Vf). The width of the final voltage distribution is equal to delta_Vpgm plus a noise factor.

In operation, the threshold voltage (Vth) distribution of the NAND flash memory device is accurately controlled by using the Increment Step Pulse Programming (ISPP) method to control the Vth of the memory cells. In the ISPP method, the program voltage is increased in stages by a determined increment by repeating program loops of a program cycle. As a programming operation is progressing, the threshold voltage of the programmed cells is increased by an increment determined in each program loop.

Thus, an exemplary embodiment method of driving a non-volatile memory device includes determining a structural shape and position of a memory cell to be driven, and driving the memory cell under an optimized operating condition based on that determination. Alternate embodiments are contemplated. For example, such alternate methods may be adapted to drive nonvolatile memory devices having memory arrays in at least a first layer and a second layer, where the memory arrays are arranged into matrices or block group sets extent in the first layer, the second layer, and/or portions of both. The operating conditions may include program, read and/or erase operating conditions, where the operating conditions of the layers, matrices and/or block group sets are different from each other.

In other embodiments, larger blocks or smaller pages may be used for groupings depending on the operation to be performed. For example, the program and read operations preferably use a page grouping for NAND type flash memory devices. On the other hand, the erase operation preferably uses a block grouping for NAND type flash memory devices. Here, the page size or depth may be 8K bytes, for example.

Another alternate embodiment includes multi-level cells (MLC), where the one shot distribution is very wide. To make the MLC distribution wider, it is desirable to make the program distribution tighter by adapting the program methods provided herein.

Although illustrative embodiments have been described herein with reference to the accompanying drawings, it is to be understood that the present disclosure is not limited to those precise embodiments, and that various other changes and modifications may be effected therein by those of ordinary skill in the pertinent art without departing from the scope or spirit of the present disclosure. All such changes and modifications are intended to be included within the scope of the present disclosure as set forth in the appended claims.

What is claimed is:

1. A memory device comprising:
 a plurality of memory cells organized into a plurality of groups based on at least one characteristic of the memory cells;
 a lookup matrix configured to store the characteristics for each of the plurality of groups; and
 a control circuit configured to provide control parameters for each of the plurality of groups responsive to the stored characteristics for that group,
 wherein the look-up matrix comprises:
  a look-up table having at least one characteristic for a plurality of groups;
  an address comparator; and
  a multiplexer connected to the address comparator and to the look-up table for providing characteristics for a group responsive to the address.

2. The device of claim 1, wherein each of the plurality of groups have a characteristic based on a location of the group within the structure of the device.

3. The device of claim 1, wherein each of the plurality of groups have a characteristic in accordance with electronic test results for the device.

4. The device of claim 1, further comprising a memory array having a spare area, wherein the characteristics are retrieved from the spare area and stored in the look-up matrix.

5. The device of claim 1,
further comprising a memory array,
wherein the look-up matrix is a nonvolatile memory separate from the memory array.

6. The device of claim 1, wherein the characteristics for each group comprises at least one of program conditions, read conditions, or erase conditions.

7. The device of claim 6, wherein the program conditions comprise at least one of an incremental step pulse programming voltage, a start voltage, a program control voltage, a maximum number of loops, a one-cycle program time, or a verification voltage for each state.

8. The device of claim 6, wherein the read conditions comprise at least one of a select read voltage, a read control voltage, or a one-cycle read time.

9. The device of claim 6, wherein the erase conditions comprise at least one of an erase voltage or an erase time.

10. The device of claim 1 wherein a range of at least one control parameter for each group is different from a range of the at least one control parameter for each other group.

11. The device of claim 1 wherein the memory cells are NAND flash memory cells.

12. The device of claim 11, wherein the control parameters comprise at least one loop program voltage applied to a page of NAND flash memory.

13. The device of claim 11, wherein the control parameters comprise at least one loop read voltage applied to a page of NAND flash memory.

14. The device of claim 11, wherein the control parameters comprise at least one erase voltage applied to a block of NAND flash memory.

15. The device of claim 1 wherein the memory cells are nonvolatile.

16. The device of claim 1, wherein the plurality of memory cells comprise at least two layers of memory cells, wherein the stored characteristics and provided control parameters are different for each layer.

17. The device of claim 1, wherein the look-up matrix further comprises non-volatile storage for storing the group at least one characteristics without a spare area.

18. The device of claim 1, wherein each of the plurality of memory cells has the same number of logic levels.

19. A method of driving a memory device, the method comprising:
organizing a plurality of memory cells into a plurality of groups based on characteristics of the memory;
storing characteristics for each group in a look-up matrix;
providing control parameters for a group responsive to its stored characteristics;
driving each memory cell in the group in accordance with its provided control parameters;
comparing the page address of a memory cell to be accessed with the block address for a group;
selecting the characteristic for the group that includes the page address; and
using the control parameters, including at least a voltage level or a timing period, that correspond to the selected group characteristic;
wherein the memory cells are NAND flash memory and each group is a memory block.

20. The method of claim 19, wherein each of the plurality of groups have a characteristic based on the location of the group within the structure of the device.

21. The method of claim 19, further comprising:
electronically testing a representative sample of the device; and
assigning characteristic for each of the plurality of groups in accordance with results of the electronic testing.

22. The method of claim 19, further comprising:
retrieving the characteristic from a spare area of the memory device; and
storing the characteristics in the look-up matrix.

23. The method of claim 19, further comprising storing the group characteristic in the look-up matrix,
wherein the look-up matrix has nonvolatile memory.

24. The method of claim 19 wherein the characteristic for each group includes at least one of program conditions, read conditions, or erase conditions.

25. The method of claim 24 wherein the program conditions include at least one of an incremental step pulse programming voltage, a start voltage, a program control voltage, a maximum number of loops, a one-cycle program time, or a verification voltage for each state.

26. The method of claim 24 wherein the read conditions include at least one of a select read voltage, a read control voltage, or a one-cycle read time.

27. The method of claim 24 wherein the erase conditions include at least one of an erase voltage or an erase time.

28. The method of claim 19 wherein a range of at least one control parameter for each group is different from a range of the at least one control parameter for each other group.

29. The method of claim 19 wherein the memory cells are NAND flash memory cells.

30. The method of claim 29 wherein the control parameters include at least one loop program voltage applied to a page of NAND flash memory.

31. The method of claim 29 wherein the control parameters include at least one loop read voltage applied to a page of NAND flash memory.

32. The method of claim 29 wherein the control parameters include at least one erase voltage applied to a block of NAND flash memory.

33. The method of claim 19 wherein the memory cells are nonvolatile.

34. The method of claim 19 wherein the plurality of memory cells include at least two layers of memory cells, and the stored characteristic and provided control parameters are different for each layer.

35. The method of claim 19 wherein each of the plurality of memory cells has the same number of logic levels.

* * * * *